United States Patent
Lin et al.

(10) Patent No.: US 11,075,104 B2
(45) Date of Patent: Jul. 27, 2021

(54) SEMICONDUCTOR CHUCK AND METHOD OF MAKING

(71) Applicant: TAIWAN SEMICONDUCTOR MANUFACTURING COMPANY LIMITED, Hsin-Chu (TW)

(72) Inventors: Fu-Zen Lin, Hsinchu (TW); Chien-Hsiang Chen, Hsinchu (TW); Chih-Shen Yang, Kouhu Township (TW); Hsu-Shui Liu, Pingjhen (TW); Cheng-Yi Huang, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/552,856

(22) Filed: Aug. 27, 2019

(65) Prior Publication Data

US 2021/0066108 A1  Mar. 4, 2021

(51) Int. Cl.
*H01L 21/687* (2006.01)
*H01L 21/683* (2006.01)

(52) U.S. Cl.
CPC .... *H01L 21/6835* (2013.01); *H01L 21/68735* (2013.01); *H01L 21/68757* (2013.01); *H01L 21/68785* (2013.01)

(58) Field of Classification Search
CPC ............... Y10T 279/23; H01L 21/6875; H01L 21/68757; H01L 21/68735; H01L 21/6833; H01L 21/6835; H01L 21/68785; H01L 21/67103
See application file for complete search history.

(56) References Cited

U.S. PATENT DOCUMENTS

| | | | | |
|---|---|---|---|---|
| 6,166,897 A * | 12/2000 | Matsunaga | ............ | H02N 13/00 361/234 |
| 7,667,944 B2 * | 2/2010 | Naim | ................ | H01L 21/67109 361/234 |
| 7,678,197 B2 * | 3/2010 | Maki | ................ | H01L 21/67103 118/724 |
| 9,580,806 B2 * | 2/2017 | Boyd, Jr. | .............. | C23C 16/507 |
| 9,685,356 B2 * | 6/2017 | Parkhe | .............. | H01L 21/67109 |
| 2016/0035610 A1 * | 2/2016 | Park | .................. | H01J 37/32715 156/345.29 |
| 2016/0064264 A1 * | 3/2016 | Kulshreshtha | ...... | H01L 21/6833 438/787 |
| 2016/0233121 A1 * | 8/2016 | Kim | ........................ | H02N 13/00 |
| 2018/0148835 A1 * | 5/2018 | Erickson | ............. | C23C 16/4411 |
| 2019/0244795 A1 * | 8/2019 | Tandou | ............... | H01L 21/6833 |

* cited by examiner

*Primary Examiner* — Chwen-Wei Su
(74) *Attorney, Agent, or Firm* — Cooper Legal Group, LLC

(57) ABSTRACT

A semiconductor chuck is provided. The semiconductor chuck includes a metal base and a first adhesive layer over the metal base. The semiconductor chuck includes a dielectric layer over the first adhesive layer, wherein the dielectric layer is adhered to the metal base by the first adhesive layer. The semiconductor chuck includes a removable protective plate over the dielectric layer, wherein a first portion of the removable protective plate covers a top surface of the dielectric layer.

20 Claims, 9 Drawing Sheets

SEMICONDUCTOR CHUCK AND METHOD OF MAKING

BACKGROUND

Semiconductor arrangements are used in a multitude of electronic devices, such as mobile phones, laptops, desktops, tablets, watches, gaming systems, and various other industrial, commercial, and consumer electronics. Semiconductor arrangements are generally formed on or from a semiconductor wafer that is subjected to a variety of semiconductor fabrication processes. The semiconductor wafer is generally supported on a chuck during at least some of the semiconductor fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
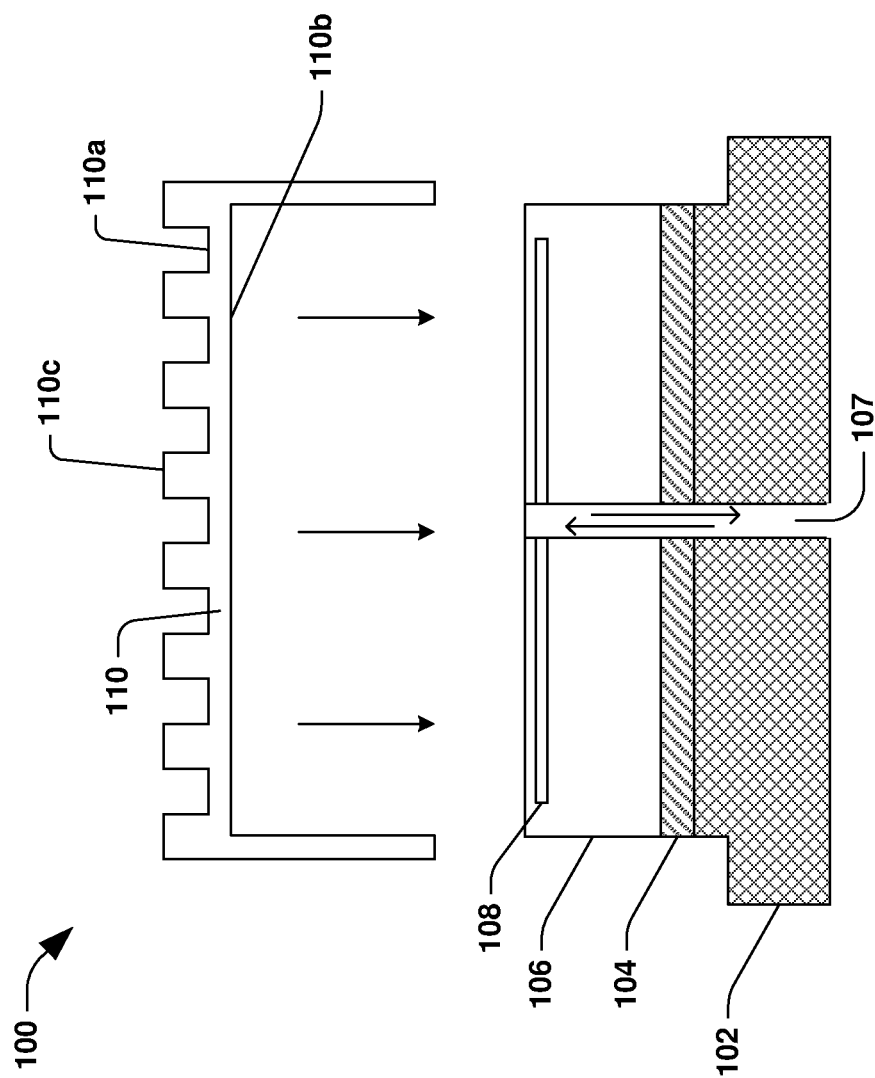
FIGS. 1-2 illustrate cross sectional views of a semiconductor chuck at various stages of fabrication, in accordance with some embodiments.

The following disclosure provides several different embodiments, or examples, for implementing different features of the provided subject matter. Specific examples of components and chucks are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

According to some embodiments, a chuck for holding a semiconductor wafer during semiconductor fabrication processes includes a removable protective plate. The chuck is at times referred to as a semiconductor chuck herein because the chuck is implemented in association with the fabrication of semiconductor arrangements. A semiconductor chuck is not, therefore, limited to a chuck comprised of merely one or more semiconductor materials. In some embodiments, the chuck is an electrostatic chuck (ESC) wherein an electrostatic force is implemented to hold the wafer on or to the chuck. In some embodiments, the protective plate protects underlying portions of the chuck from harsh environmental conditions, such as plasma, etching chemicals, etc., used during one or more of the semiconductor fabrication processes. In some embodiments, one of the layers under the protective plate is a dielectric layer, such as a ceramic layer, that has a conductive layer embedded therein, such as a line, a trace, etc. In some embodiments, the conductive layer is used in implementing the electrostatic force to maintain the wafer relative to the chuck. In some embodiments, the dielectric layer having the conductive layer is a relatively expensive part of the chuck such that implementing the protective plate to protect the dielectric layer affords considerable savings as compared to scenarios where the protective plate is not implemented and the chuck is thereby exposed to harsh environmental conditions that erode or otherwise damage the dielectric layer. In some embodiments, the protective plate simplifies, streamlines, etc. the fabrication process at least because the protective plate is less susceptible to harsh environmental conditions as compared to portions of the chuck which are protected by the protective plate such that maintenance to the chuck is needed less frequently as compared to scenarios where the protective plate is not implemented. In some embodiments, replacing or refurbishing the protective plate is at least one of less expensive or less time consuming than replacing or refurbishing one or more other portions of the chuck, such as the dialectic layer containing the conducive feature, that are eroded or otherwise damaged due to exposure to harsh environmental conditions when the protective plate is not implemented.

Some embodiments relate to a semiconductor chuck. In accordance with some embodiments, the semiconductor chuck includes a metal base and a first adhesive layer over the metal base. In some embodiments, the semiconductor chuck includes a dielectric layer over the first adhesive layer. In some embodiments, the dielectric layer is adhered to the metal base by the first adhesive layer. In some embodiments, the semiconductor chuck includes a removable protective plate over the dielectric layer. In some embodiments, the first protective plate partially covers a top surface of the dielectric layer.

According to some embodiments, the semiconductor chuck includes a second adhesive layer between the removable protective plate and a top surface of the dielectric layer. In some embodiments, the second adhesive layer is between the removable protective plate and a sidewall of the dielectric layer. In some embodiments, the second adhesive layer is between the removable protective plate and a sidewall of the first adhesive layer. In some embodiments, the removable protective plate is adhered to at least one of the top surface of the dielectric layer, the sidewall of the dielectric layer, or the sidewall of the first adhesive layer by the second adhesive layer.

According to some embodiments, a semiconductor chuck includes a metal base, a first adhesive layer over the metal base, and a dielectric layer over the first adhesive layer. In some embodiments, the dielectric layer is adhered to the metal base by the first adhesive layer. In some embodiments, the semiconductor chuck includes a removable protective plate. In some embodiments, the removable protective plate covers a sidewall of the first adhesive layer. In some embodiments, the removable protective layer covers a sidewall of the dielectric layer. In some embodiments, the removable protective plate covers a sidewall of the metal base.

In some embodiments, the semiconductor chuck includes a second adhesive layer between the removable protective plate and a top surface of the dielectric layer. In some embodiments, the second adhesive layer is between the removable protective plate and the sidewall of the dielectric layer. In some embodiments, the second adhesive layer is between the removable protective plate and the sidewall of the first adhesive layer. In some embodiments, the second adhesive layer is between the removable protective plate and the sidewall of the metal base. In some embodiments, the removable protective plate is adhered to at least one of the top surface of the dielectric layer, the sidewall of the dielectric layer, the sidewall of the first adhesive layer, or the sidewall of the metal base by the second adhesive layer.

According to some embodiments, a method for forming a semiconductor chuck includes placing a first removable protective plate over a stack. In some embodiments, the stack includes a metal base, a first adhesive layer over the metal base, and a dielectric layer over the first adhesive layer. In some embodiments, placing the first removable protective plate includes covering a top surface of the dielectric layer with a first portion of the first removable protective plate and covering a sidewall of the first adhesive layer with a second portion of the first removable protective plate.

Figure 2:
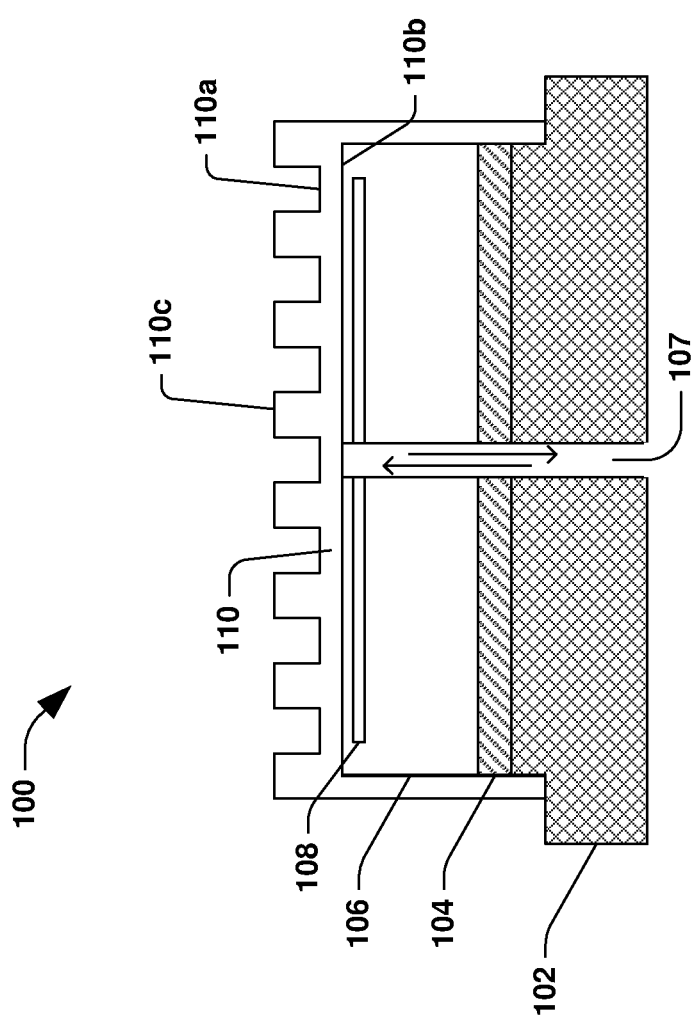

FIGS. 1-2 are cross sectional views illustrating the semiconductor chuck 100 during fabrication, in accordance with some embodiments, where a removable protective plate 110 is disassociated or removed from other portions of the chuck in FIG. 1 and is associated with other portions of the chuck in FIG. 2.

Referring to FIG. 1, the semiconductor chuck 100 includes a metal base 102, and a first adhesive layer 104 over the metal base 102, according to some embodiments. In some embodiments, the semiconductor chuck 100 includes a dielectric layer 106 over the first adhesive layer 104. In some embodiments, the dielectric layer 106 is adhered to the metal base by the first adhesive layer 104. In some embodiments, the semiconductor chuck 100 includes a conductive layer 108 in the dielectric layer 106.

In some embodiments, the metal base 102 includes at least one of copper or other suitable materials. In some embodiments, the metal base 102 is about 3 millimeters thick. In some embodiments, the metal base 102 is the bottom-most layer of the semiconductor chuck 100. In some embodiments, the metal base 102 is not the bottom-most layer of the semiconductor chuck 100.

In some embodiments, the first adhesive layer 104 includes at least one of a glue, such as silicon glue, a water-soluble compound, a water-insoluble compound, a commercially available adhesive, an organic compound, an inorganic compound, a hydrocarbon, benzocyclobutene (BCB), a low dielectric constantan material, a photoresist, an SU-8 compound, or other suitable materials. In some embodiments, a low dielectric constantan material is a material having a dielectric constant of about 3.9 or less. In some embodiments, a photoresist is a light sensitive material such that properties, such as solubility, of the photoresist are affected by the light. The photoresist is either a negative photoresist or a positive photoresist. With respect to the negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In the positive photoresist, illuminated regions of the positive photoresist become soluble and are removed via application of the solvent during development. Thus, a pattern formed in the positive photoresist is a positive image of opaque regions of the template between the light source and the positive photoresist.

In some embodiments, the first adhesive layer 104 is about 5 micrometers thick. In some embodiments, a thickness of the first adhesive layer 104 is less than a thickness of the metal base 102. In some embodiments, the first adhesive layer 104 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, a passivation process, or other suitable techniques. In some embodiments, the first adhesive layer 104 is formed, applied, etc. as gel, in a gelatinous state, etc. In some embodiments, the first adhesive layer 104 is formed, applied, etc. at least partially in a mechanized manner, such as using a robot, etc. to distribute the first adhesive layer 104 on, over, etc. the metal base 102. In some embodiments, the first adhesive layer 104 is formed, applied, etc. at least partially in a manual manner, such as by a human distributing the first adhesive layer 104 on, over, etc. the metal base 102. In some embodiments, the first adhesive layer 104 is formed, applied, etc. in one or more stages, operations, etc. In some embodiments, forming, applying, etc. the first adhesive layer 104 includes one or more curing stages, operations, etc., such as at least one of curing at a temperature of about 20 degrees Celsius to about 25 degrees Celsius, curing at a temperature of about 120 degrees Celsius, curing at a temperature of about 125 degrees Celsius, or curing for about 30 minutes. In some embodiments, the first adhesive layer 104 has a viscosity of about 3,600 cps. In some embodiments, the first adhesive layer 104 is resistant to a temperature of about 150 degrees Celsius to about −45 degrees Celsius. In some embodiments, the first adhesive layer 104 is resistant to chemicals. In some embodiments, the first adhesive layer 104 is resistant to Ozone.

In some embodiments, the dielectric layer 106 includes at least one of $Al_2O_3$, AlN, $Y_2O_3$, or other suitable materials. In some embodiments, the dielectric layer 106 is about 4 millimeters thick. In some embodiments, a thickness of the dielectric layer 106 is less than a thickness of the metal base 102. In some embodiments, a thickness of the dielectric layer 106 is greater than a thickness of the first adhesive layer 104. In some embodiments, the dielectric layer 106 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, a passivation process, or other suitable techniques.

In some embodiments, the conductive layer 108 includes at least one of tungsten, copper, or other suitable materials. In some embodiments, the conductive layer 108 is about 3 micrometers thick. In some embodiments, the conductive layer 108 is embedded in the dielectric layer 106. In some embodiments, an opening is formed in the dielectric layer 106, such as by etching, and the conductive layer 108 is formed in the opening. In some embodiments, additional material of the dielectric layer 106 is formed over the conductive layer 108 such that the conductive layer 108 is embedded in the dielectric layer 106. In some embodiments, the conductive layer 108 is used in developing an electrostatic force to maintain a semiconductor wafer on the semiconductor chuck 100. In some embodiments, the conductive layer 108 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, a passivation process, or other suitable techniques.

In some embodiments, the removable protective plate 110 has a front side 110a and a backside 110b. In some embodiments, the front side 110a of the removable protective plate 110 is recessed such that one or more ridges 110c are on the front side 110a of the removable protective plate 110. In some embodiments, a semiconductor wafer rests on the one or more ridges during semiconductor fabrication processes. In some embodiments, the removable protective plate 110 includes at least one of $Al_2O_3$, AlN, $Y_2O_3$, or other suitable materials. In some embodiments, the removable protective plate 110 has a same material composition as the dielectric layer 106. In some embodiments, the removable protective plate 110 has a different material composition than the dielectric layer 106. In some embodiments, the removable protective plate 110 is about 0.3 millimeters to about 5 millimeters thick.

As illustrated in FIG. 2, the removable protective plate 110 is dimensioned to fit over at least some of the other portions of the semiconductor chuck 100, according to some embodiments. In some embodiments, the removable protective plate 110 covers at least some of at least one of a top surface of the dielectric layer 106, a sidewall of the dielectric layer 106, a sidewall of the first adhesive layer 104, or a sidewall of the metal base 102. In some embodiments, a horizontal or first portion of the removable protective plate 110 is said to cover the top surface of the dielectric layer 106. In some embodiments, a vertical or second portion of the removable protective plate 110 is said to cover at least one of the sidewall of the dielectric layer 106, the sidewall of the first adhesive layer 104, or the sidewall of the metal base 102. In some embodiments, a stack is said to comprise at least one of the dielectric layer 106, the first adhesive layer 104, or the metal base 102 such that the removable protective plate 110 covers at least some of the stack. In some embodiments, the backside 110b of the removable protective plate 110 is in direct contact with at least some of at least one of the top surface of the dielectric layer 106, the sidewall of the dielectric layer 106, the sidewall of the first adhesive layer 104, or the sidewall of the metal base 102.

In some embodiments, a channel 107 is defined within at least some of the semiconductor chuck 100 such that the backside 110b of the removable protective plate 110 is exposed by or through the channel 107. In some embodiments, at least one of a gas or liquid is used to cool the semiconductor chuck 100 by flowing into and out of the channel 107 as illustrated by arrows in the FIGs. In some embodiments, thermal energy transfer occurs between the fluid flowing into the channel 107, contacting the backside 110b of the removable protective plate 110, and flowing out of the channel 107. In some embodiments, given that the semiconductor wafer rests upon the ridges 110c during semiconductor fabrication processes, thermal energy transfer also occurs with respect to the wafer, such as through the removable protective plate 110, as the fluid, such as helium, circulates into and out of the channel 107. In various embodiments, the electrostatic force generated between the wafer and the semiconductor chuck 100 enhances a solid-to-solid contact, such as between the ridges 110c of the removable protective plate 110 and the semiconductor wafer, for thermal conduction.

In some embodiments, the channel is oriented other than as illustrated, such as where at least some of the channel 107 has a lateral, as opposed to merely vertical, aspect. In some embodiments, the channel 107 is merely in the dielectric layer 106. In some embodiments, the channel 107 is in the dielectric layer 106 and the first adhesive layer 104 but not the metal base 102. In some embodiments, multiple channels are defined in the semiconductor chuck 100. In some embodiments, at least some of the multiple channels are connected to one another so as to share at least one of an input or an output. In some embodiments, at least some of the multiple channels are not connected to one another so as to have separate inputs and separate outputs. In some embodiments, at least some of the multiple channels are formed in different layers or combinations of layer such that a first channel is defined in a first layer or combination of layers while a second channel is defined in a different layer or combination of layers.

Figure 3:
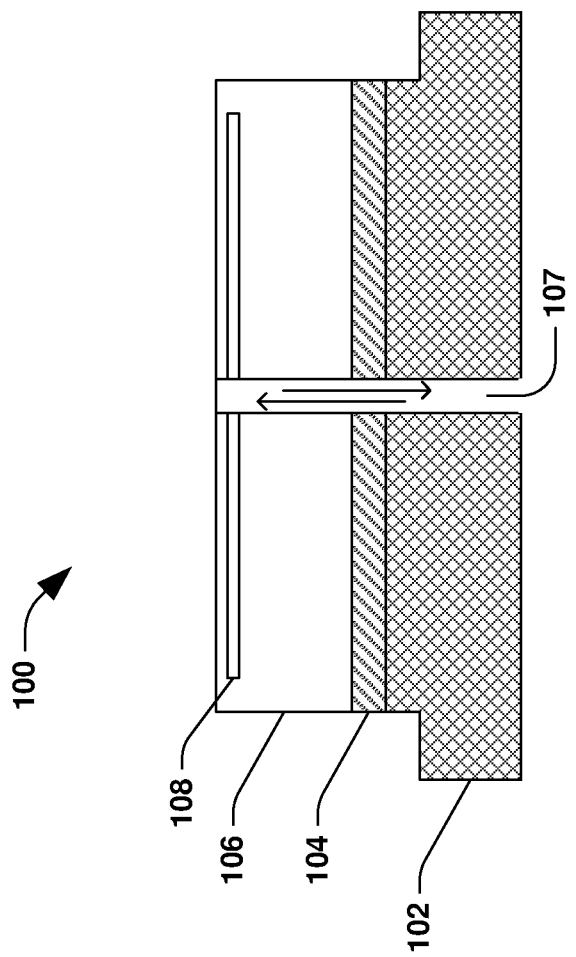
FIG. 3-4 illustrates cross sectional views of a semiconductor chuck during fabrication, in accordance with some embodiments.
Figure 4:
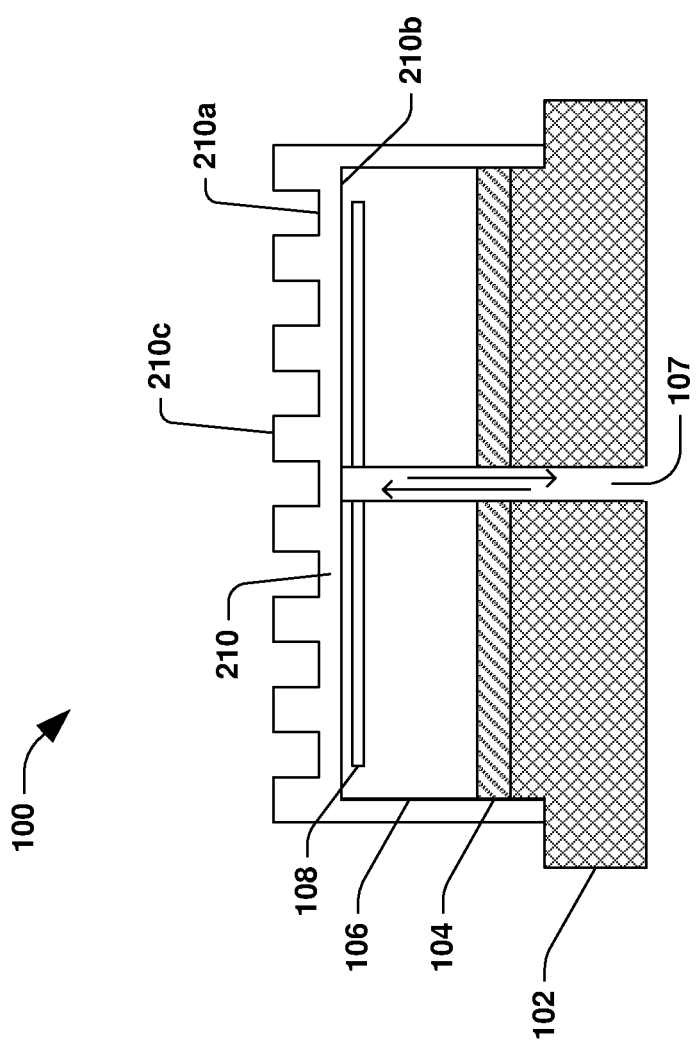

FIG. 3-4 are cross sectional views illustrating the semiconductor chuck 100 during fabrication, in accordance with some embodiments.

Referring to FIG. 3, the removable protective plate 110 is removed, according to some embodiments. In some embodiments, the removable protective plate 110 is removed because the removable protective plate 110 is damaged, worn, degraded, etc. as a result of harsh conditions present during various semiconductor fabrication processes. In some embodiments, the removable protective plate 110 is damaged as a result of exposure to at least one of plasma, etching chemicals, etc. In some embodiments, the removable protective plate 110 is so damaged that the first adhesive layer 104 is exposed. In some embodiments, upon being exposed to the plasma, etching chemicals, etc. the first adhesive layer 104 is eroded or otherwise at least partially removed. In some embodiments, absence of at least some of the first adhesive layer 104 provides a pathway for fluid flowing inside the channel 107 to undesirably escape into a processing chamber. In some embodiments, the removable protective plate 110 is so damaged that dielectric layer 106 is exposed. In some embodiments, upon being exposed to the plasma, etching chemicals, etc. the dielectric layer 106 is eroded or otherwise at least partially removed. In some embodiments, absence of at least some of the dielectric layer 106 provides a pathway for fluid flowing inside the channel 107 to undesirably escape into the processing chamber. In some embodiments, absence of at least some of the dielectric layer 106 undesirably exposes the conductive layer 108 to the plasma, etching chemicals, etc. In some embodiments, the removable protective plate 110 is so damaged that the metal base 102 is exposed. In some embodiments, upon being exposed to the plasma, etching chemicals, etc. the metal base 102 is eroded or otherwise at least partially removed. In some embodiments, absence of at least some of the metal base 102 provides a pathway for fluid flowing inside the channel 107 to undesirably escape into the processing chamber.

In some embodiments, the removable protective plate 110 is removed using at least one of wet etching, dry etching, lithography, or other suitable techniques. In some embodiments, the removable protective plate 110 is removed with little to no impact on other portions of the semiconductor chuck 100, such as the metal base 102, the first adhesive layer 104, the dielectric layer 106, and the conductive layer 108.

Referring to FIG. 4, in some embodiments, after removing the removable protective plate 110, a second removable protective plate 210 is dimensioned to fit over at least some of the other portions of the semiconductor chuck 100, according to some embodiments. In some embodiments, the second removable protective plate 210 covers at least some of at least one of the top surface of the dielectric layer 106, the sidewall of the dielectric layer 106, the sidewall of the first adhesive layer 104, or the sidewall of the metal base 102. In some embodiments, a horizontal or first portion of the second removable protective plate 210 is said to cover the top surface of the dielectric layer 106. In some embodiments, a vertical or second portion of the second removable protective plate 210 is said to cover at least one of the sidewall of the dielectric layer 106, the sidewall of the first adhesive layer 104, or the sidewall of the metal base 102. In some embodiments, a stack is said to comprise at least one of the dielectric layer 106, the first adhesive layer 104, or the metal base 102 such that the second removable protective plate 210 covers at least some of the stack.

In some embodiments, the second removable protective plate 210 has a front side 210a and a backside 210b. In some embodiments, the front side 210a of the second removable protective plate 210 is recessed such that one or more ridges 210c are on the front side 210a of the second removable protective plate 210. In some embodiments, a semiconductor wafer rests on the one or more ridges during semiconductor fabrication processes. In some embodiments, the backside 210b of the second removable protective plate 210 is in direct contact with at least some of at least one of the top surface of the dielectric layer 106, the sidewall of the dielectric layer 106, the sidewall of the first adhesive layer 104, or the sidewall of the metal base 102. In some embodiments, the second removable protective plate 210 includes at least one of $Al_2O_3$, AlN, $Y_2O_3$, or other suitable materials. In some embodiments, the second removable protective plate 210 has a same material composition as the dielectric layer 106. In some embodiments, the second removable protective plate 210 has a different material composition than the dielectric layer 106. In some embodiments, the second removable protective plate 210 has a same material composition as the removable protective plate 110. In some embodiments, the second removable protective plate 210 has a different material composition than the removable protective plate 110. In some embodiments, the second removable protective plate 210 is about 0.3 millimeters to about 5 millimeters thick. In some embodiments, a thickness of the second removable protective plate 210 is the same as the thickness of the removable protective plate 110. In some embodiments, the thickness of the second removable protective plate 210 is different than the thickness of the removable protective plate 110.

Figure 5:
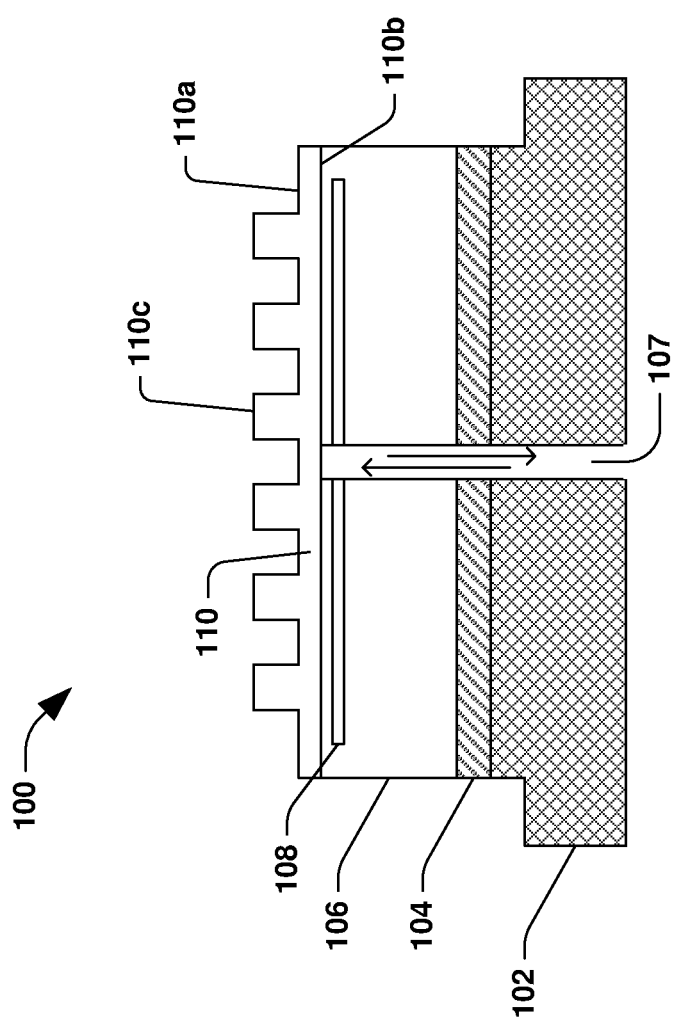
FIG. 5 illustrates cross sectional view of a semiconductor chuck, in accordance with some embodiments.

FIG. 5 is a cross sectional view illustrating the semiconductor chuck 100 according to some embodiments. In some embodiments, the removable protective plate 110 covers the top surface of the dielectric layer 106. In some embodiments, the removable protective plate 110 does not cover at least one of the sidewall of the dielectric layer 106, the sidewall of the first adhesive layer 104, or the sidewall of the metal base 102. In some embodiments, the backside 110b of the removable protective plate 110 is in direct contact with at least some of the top surface of the dielectric layer 106. In some embodiments, the front side 110a of the removable protective plate 110 is recessed such that the one or more ridges 110c are on the front side 110a of the removable protective plate 110. In some embodiments, a semiconductor wafer rests on the one or more ridges during semiconductor fabrication processes. In some embodiments, the removable protective plate 110 includes at least one of $Al_2O_3$, AlN, $Y_2O_3$, or other suitable materials. In some embodiments, the removable protective plate 110 has a same material composition as the dielectric layer 106. In some embodiments, the removable protective plate 110 has a different material composition than the dielectric layer 106. In some embodiments, the removable protective plate 110 is about 0.3 millimeters to about 5 millimeters thick.

Figure 6:
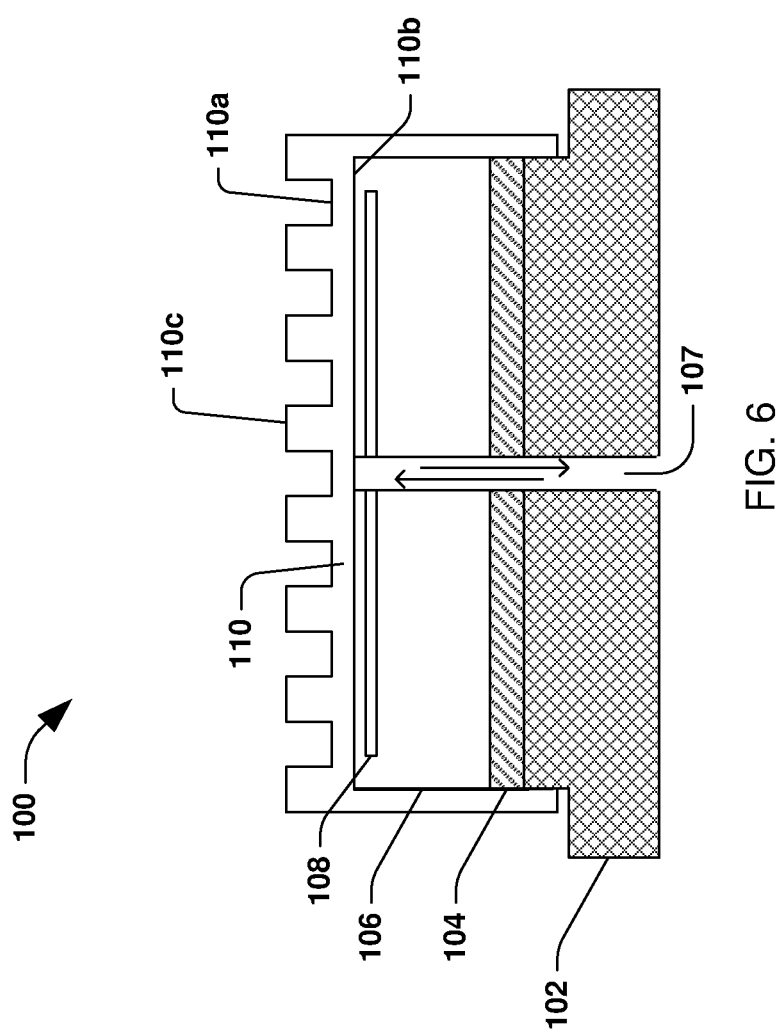
FIG. 6 illustrates a cross sectional view of a semiconductor chuck, in accordance with some embodiments.

FIG. 6 is a cross sectional view illustrating the semiconductor chuck 100 according to some embodiments. In some embodiments, the removable protective plate 110 covers the top surface of the dielectric layer 106 and the sidewalls of the dielectric layer 106. In some embodiments, the removable protective plate 110 covers the sidewalls of the first adhesive layer 104. In some embodiments, the removable protective plate 110 covers some, but not all, of the sidewalls of the metal base 102. In some embodiments, a horizontal or first portion of the removable protective plate 110 is said to cover the top surface of the dielectric layer 106. In some embodiments, a vertical or second portion of the removable protective plate 110 is said to cover at least one of the sidewall of the dielectric layer 106, the sidewall of the first adhesive layer 104, or the sidewall of the metal base 102. In some embodiments, a stack is said to comprise at least one of the dielectric layer 106, the first adhesive layer 104, or the metal base 102 such that the removable protective plate 110 covers at least some of the stack. In some embodiments, the backside 110b of the removable protective plate 110 is in direct contact with at least some of at least one of the top surface of the dielectric layer 106, the sidewall of the dielectric layer 106, the sidewall of the first adhesive layer 104, or the sidewall of the metal base 102. In some embodiments, the front side 110a of the removable protective plate 110 is recessed such that the one or more ridges 110c are on the front side 110a of the removable protective plate 110. In some embodiments, a semiconductor wafer rests on the one or more ridges during semiconductor fabrication processes. In some embodiments, the removable protective plate 110 includes at least one of $Al_2O_3$, AlN, $Y_2O_3$, or other suitable materials. In some embodiments, the removable protective plate 110 has a same material composition as the dielectric layer 106. In some embodiments, the removable protective plate 110 has a different material composition than the dielectric layer 106. In some embodiments, the removable protective plate 110 is about 0.3 millimeters to about 5 millimeters thick.

Figure 7:
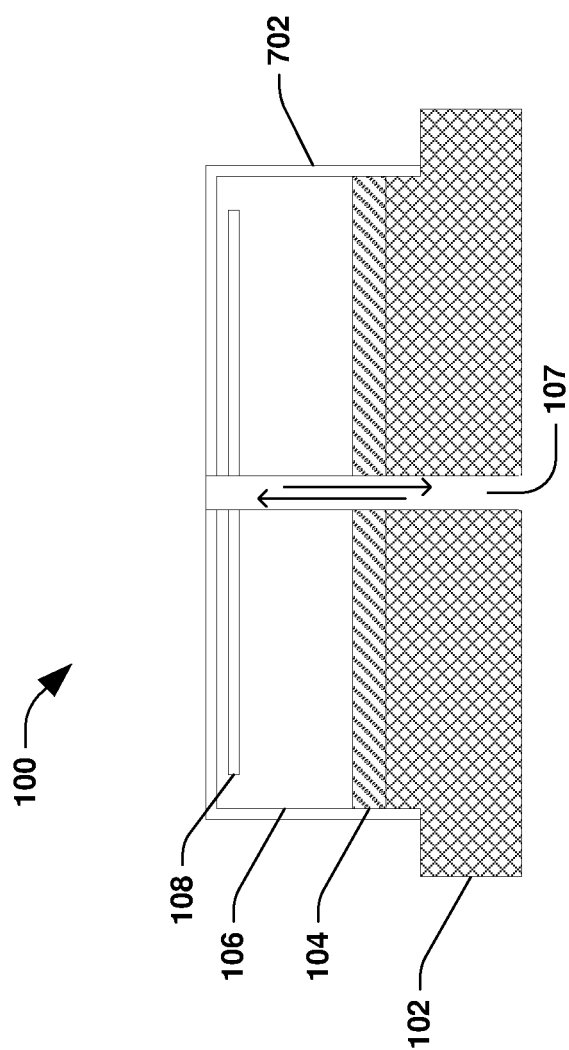
FIGS. 7-9 illustrate cross sectional views of a semiconductor chuck at various stages of fabrication, in accordance with some embodiments.
Figure 8:
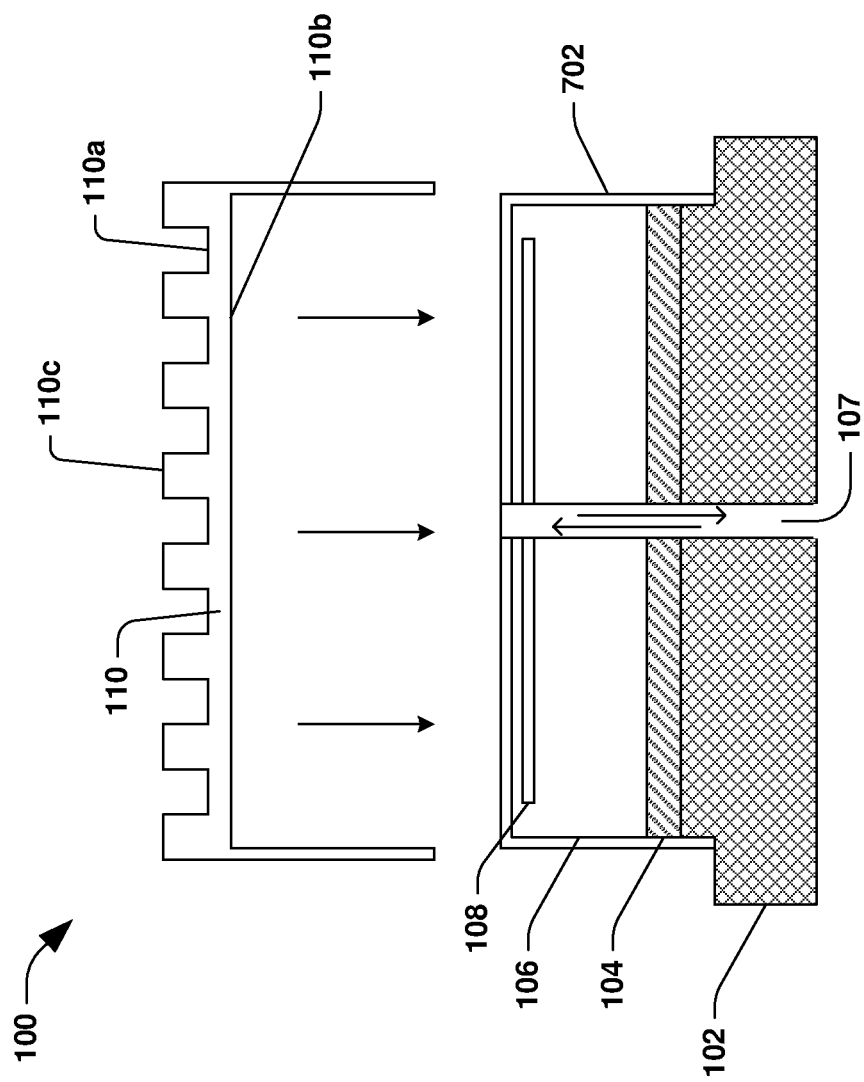
Figure 9:
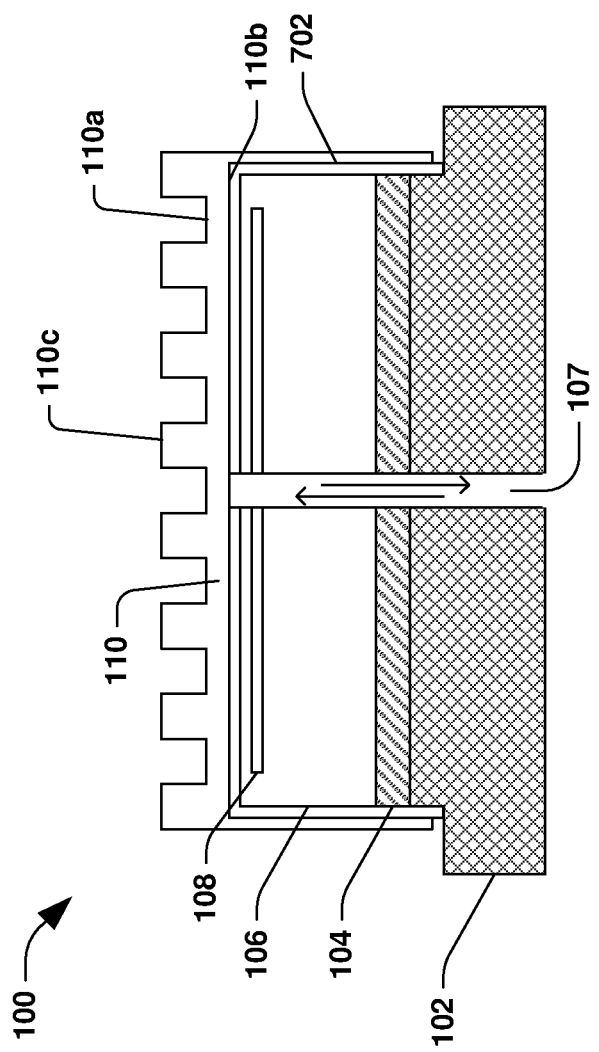

FIGS. 7-9 are cross sectional views illustrating the semiconductor chuck 100 during fabrication, in accordance with some embodiments.

As illustrated in FIG. 7, in some embodiments, fabricating the semiconductor chuck 100 includes forming a second adhesive layer 702 over at least some of at least one of the top surface of the dielectric layer 106, the sidewall of the dielectric layer 106, the sidewall of the first adhesive layer 104, or the sidewall of the metal base 102. In some embodiments, the second adhesive layer 702 covers at least some of the top surface of the dielectric layer 106. In some embodiments, the second adhesive layer 702 covers at least some of the sidewall of the dielectric layer 106. In some embodiments, the second adhesive layer 702 covers at least some of the sidewall of the first adhesive layer 104. In some embodiments, the second adhesive layer 702 covers at least some of the sidewall of the metal base 102. In some embodiments, the second adhesive layer 702 partially covers the sidewall of the metal base 102. In some embodiments, the second adhesive layer 702 is in direct contact with at least some of at least one of the top surface of the dielectric layer 106, the sidewall of the dielectric layer 106, the sidewall of the first adhesive layer 104, or the sidewall of the metal base 102.

In some embodiments, the second adhesive layer 702 includes at least one of a glue, such as silicon glue, a water-soluble compound, a water-insoluble compound, a commercially available adhesive, an organic compound, an inorganic compound, a hydrocarbon, benzocyclobutene (BCB), a low dielectric constantan material, a photoresist, an SU-8 compound, or other suitable materials. In some embodiments, the second adhesive layer 702 has a same material composition as the first adhesive layer 104. In some embodiments, the second adhesive layer 702 does not have a same material composition as the first adhesive layer 104. In some embodiments, the second adhesive layer 702 is about 4 micrometers thick. In some embodiments, a thickness of the second adhesive layer 702 is less than a thickness of the metal base 102. In some embodiments, the thickness of the second adhesive layer 702 is less than the thickness of the first adhesive layer 104. In some embodiments, the second adhesive layer 702 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, a passivation process, or other suitable techniques. In some embodiments, the second adhesive layer 702 is formed, applied, etc. as gel, in a gelatinous state, etc. In some embodiments, the second adhesive layer 702 is formed, applied, etc. at least partially in a mechanized manner, such as using a robot, etc. to distribute the second adhesive layer 702 on, over, etc. at least some of at least one of the top surface of the dielectric layer 106, the sidewall of the dielectric layer 106, the sidewall of the first adhesive layer 104, or the sidewall of the metal base 102. In some embodiments, the second adhesive layer 702 is formed, applied, etc. at least partially in a manual manner, such as by a human distributing the second adhesive layer 702 on, over, etc. at least some of at least one of the top surface of the dielectric layer 106, the sidewall of the dielectric layer 106, the sidewall of the first adhesive layer 104, or the sidewall of the metal base 102. In some embodiments, the second adhesive layer 702 is formed, applied, etc. in one or more stages, operations, etc. In some embodiments, forming, applying, etc. the second adhesive layer 702 includes one or more curing stages, operations, etc., such as at least one of curing at a temperature of about 20 degrees Celsius to about 25 degrees Celsius, curing at a temperature of about 120 degrees Celsius, curing at a temperature of about 125 degrees Celsius, or curing for about 30 minutes. In some embodiments, the second adhesive layer 702 has a viscosity of about 3,600 cps. In some embodiments, the second adhesive layer 702 is resistant to a temperature of about 150 degrees Celsius to about −45 degrees Celsius. In some embodiments, the second adhesive layer 702 is resistant to chemicals. In some embodiments, the second adhesive layer 702 is resistant to Ozone.

Referring to FIGS. 8 and 9, the removable protective plate 110 is dimensioned to fit over the second adhesive layer 702 and at least some of the other portions of the semiconductor chuck 100, according to some embodiments. In some embodiments, the second adhesive layer 702 adheres the removable protective plate 110 to at least one of the top surface of the dielectric layer 106, the sidewall of the dielectric layer 106, the sidewall of the first adhesive layer 104, or the sidewall of the metal base 102. In some embodiments, the removable protective plate 110 covers at least some of at least one of the top surface of the dielectric layer 106, the sidewall of the dielectric layer 106, the sidewall of the first adhesive layer 104, or the sidewall of the metal base 102. In some embodiments, a horizontal or first portion of at least one of the second adhesive layer 702 or the removable protective plate 110 is said to cover the top surface of the dielectric layer 106. In some embodiments, a vertical or second portion of at least one of the second adhesive layer 702 or the removable protective plate 110 is said to cover at least one of the sidewall of the dielectric layer 106, the sidewall of the first adhesive layer 104, or the sidewall of the metal base 102. In some embodiments, a stack is said to comprise at least one of the dielectric layer 106, the first adhesive layer 104, or the metal base 102 such that at least one of the second adhesive layer 702 or the removable protective plate 110 covers at least some of the stack.

In some embodiments, the channel 107 is defined within the second adhesive layer 702 such that the backside 110b of the removable protective plate 110 is exposed by or through the channel 107.

According to some embodiments, a chuck that includes a removable protective plate for holding a semiconductor wafer during semiconductor fabrication processes as provided herein provides a more efficient and cost effective option as compared to a chuck that does not include a removable protective plate. In some embodiments, the protective plate protects underlying portions of the chuck from harsh environmental conditions, such as plasma, etching chemicals, etc., used during one or more of the semiconductor fabrication processes. In some embodiments, replacing or refurbishing the protective plate is at least one of less expensive or less time consuming than replacing or refurbishing one or more other portions of the chuck that are eroded or otherwise damaged due to exposure to harsh environmental conditions when the protective plate is not implemented.

According to some embodiments, a semiconductor chuck includes a metal base and a first adhesive layer over the metal base. The semiconductor chuck includes a dielectric layer over the first adhesive layer, wherein the dielectric layer is adhered to the metal base by the first adhesive layer. The semiconductor chuck includes a removable protective plate over the dielectric layer, wherein a first portion of the removable protective plate covers a top surface of the dielectric layer.

According to some embodiments, a semiconductor chuck includes a metal base and a first adhesive layer over the metal base. The semiconductor chuck includes a dielectric layer over the first adhesive layer, wherein the dielectric layer is adhered to the metal base by the first adhesive layer. The semiconductor chuck includes a removable protective plate, wherein a first portion of the removable protective plate covers at least one of a sidewall of the first adhesive layer, a sidewall of the dielectric layer, or a sidewall of the metal base.

According to some embodiments, a method for forming a semiconductor chuck includes placing a first removable protective plate over a stack. The stack includes a metal base, a first adhesive layer over the metal base, and a dielectric layer over the first adhesive layer. Placing the first removable protective plate includes covering a top surface of the dielectric layer with a first portion of the first removable protective plate and covering a sidewall of the first adhesive layer with a second portion of the first removable protective plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising".

Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor chuck, comprising:
    a metal base;
    a first adhesive layer over the metal base;
    a dielectric layer over the first adhesive layer, wherein the dielectric layer is adhered to the metal base by the first adhesive layer; and
    a removable protective plate configured to be selectively disposed over the dielectric layer, separated from the dielectric layer, and redisposed over the dielectric layer, wherein:
        a first portion of the removable protective plate covers a top surface of the dielectric layer when the removable protective plate is disposed over the dielectric layer, and
        a channel is defined in the dielectric layer to expose a back side of the removable protective plate.

2. The semiconductor chuck of claim 1, wherein a second portion of the removable protective plate covers at least one of a sidewall of the dielectric layer, a sidewall of the first adhesive layer, or a sidewall of the metal base when the removable protective plate is disposed over the dielectric layer.

3. The semiconductor chuck of claim 1, comprising:
    a second adhesive layer between the removable protective plate and at least one of the top surface of the dielectric layer, a sidewall of the dielectric layer, or a sidewall of the first adhesive layer, wherein the removable protective plate is adhered to at least one of the top surface of the dielectric layer, the sidewall of the dielectric layer, or the sidewall of the first adhesive layer by the second adhesive layer when the removable protective plate is disposed over the dielectric layer.

4. The semiconductor chuck of claim 1, wherein the channel is defined in at least one of the first adhesive layer or the metal base.

5. The semiconductor chuck of claim 1, wherein the dielectric layer comprises at least one of $Al_2O_3$, AlN, or $Y_2O_3$.

6. The semiconductor chuck of claim 1, wherein the removable protective plate comprises at least one of $Al_2O_3$, AlN, or $Y_2O_3$.

7. The semiconductor chuck of claim 1, wherein a front side of the removable protective plate comprises ridges to support a semiconductor wafer.

8. The semiconductor chuck of claim 1, comprising a conductive layer in the dielectric layer.

9. A semiconductor chuck, comprising:
a base layer;
a dielectric layer over the base layer; and
a removable protective plate over the dielectric layer, wherein:
the removable protective plate comprises a plurality of ridges extending in a direction opposite to the dielectric layer,
a channel is defined in the dielectric layer,
the channel is capped by the removable protective plate such that when a semiconductor wafer is supported by the removable protective plate, the removable protective plate separates the channel from the semiconductor wafer,
the dielectric layer overlies a first top surface of the base layer,
a second top surface of the base layer does not underlie the dielectric layer, and
the removable protective plate overlies the second top surface.

10. The semiconductor chuck of claim 9, wherein:
the removable protective plate has a first thickness at a first ridge of the plurality of ridges, a second thickness at a second ridge of the plurality of ridges, and a third thickness at a location between the first ridge and the second ridge, and
the third thickness is less than the first thickness and is less than the second thickness.

11. The semiconductor chuck of claim 9, wherein the removable protective plate contacts a sidewall and a top surface of the base layer.

12. The semiconductor chuck of claim 9, wherein the removable protective plate is in contact with a top surface of the base layer.

13. The semiconductor chuck of claim 9, wherein a back side of the removable protective plate is exposed by the channel.

14. The semiconductor chuck of claim 9, comprising an adhesive layer between the base layer and the dielectric layer.

15. The semiconductor chuck of claim 9, comprising an adhesive layer between the dielectric layer and the removable protective plate.

16. A semiconductor chuck, comprising:
a base layer;
a dielectric layer over the base layer; and
a removable protective plate over the dielectric layer, wherein:
the removable protective plate comprises a plurality of ridges extending in a direction opposite to the dielectric layer,
a channel is defined in the dielectric layer,
the channel is capped by the removable protective plate such that when a semiconductor wafer is supported by the removable protective plate, the removable protective plate separates the channel from the semiconductor wafer, and
the removable protective plate is in contact with a top surface of the base layer.

17. The semiconductor chuck of claim 16, wherein the removable protective plate contacts a sidewall of the base layer.

18. The semiconductor chuck of claim 16, wherein a back side of the removable protective plate is exposed by the channel.

19. The semiconductor chuck of claim 16, comprising an adhesive layer between the base layer and the dielectric layer.

20. The semiconductor chuck of claim 16, comprising an adhesive layer between the dielectric layer and the removable protective plate.

* * * * *